(12) United States Patent
Sarin

(10) Patent No.: US 9,349,474 B2
(45) Date of Patent: May 24, 2016

(54) APPARATUSES AND METHODS FOR LIMITING STRING CURRENT IN A MEMORY

(71) Applicant: Micron Technology, Inc., Boise, ID (US)

(72) Inventor: Vishal Sarin, Saratoga, CA (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 13/924,310

(22) Filed: Jun. 21, 2013

(65) Prior Publication Data

US 2014/0376313 A1 Dec. 25, 2014

(51) Int. Cl.
*G11C 16/30* (2006.01)
*G11C 7/14* (2006.01)
*G11C 16/26* (2006.01)
*G11C 16/34* (2006.01)
*G11C 16/04* (2006.01)

(52) U.S. Cl.
CPC *G11C 16/30* (2013.01); *G11C 7/14* (2013.01); *G11C 16/26* (2013.01); *G11C 16/3459* (2013.01); *G11C 16/0483* (2013.01)

(58) Field of Classification Search
CPC ........... G11C 5/147; G11C 2211/5634; G11C 16/0483
USPC .................................. 365/189, 148, 210, 154
IPC ..................... G11C 16/30, 16/0483, 16/26, 7/14
See application file for complete search history.

(56) References Cited

U.S. PATENT DOCUMENTS

| | | | | |
|---|---|---|---|---|
| 2005/0207237 | A1* | 9/2005 | Isobe | 365/189.11 |
| 2005/0219914 | A1* | 10/2005 | Sarin | G11C 7/12 365/189.03 |
| 2006/0291322 | A1* | 12/2006 | Crippa | G11C 7/04 365/230.06 |
| 2012/0155177 | A1* | 6/2012 | Wang | G11C 16/28 365/185.17 |

OTHER PUBLICATIONS

Analog integrated Circuit by Edwin W. Greeneich, Springer, 1997, 1st Edition, p. 37-38.*
Analog integrated Circuit by Edwin W. Greeneich, Springer, 1997, 1st Edition, p. 37-38.*

* cited by examiner

*Primary Examiner* — Shawki S Ismail
*Assistant Examiner* — Muhammad S Islam
(74) *Attorney, Agent, or Firm* — Dorsey & Whitney LLP

(57) ABSTRACT

Apparatuses, current control circuits, and methods for limiting string current in a memory are described. An example apparatus includes a memory cell string including a memory cell. The example apparatus further includes a sense circuit configured to sense a current through the memory cell string, and a select gate configured to couple the memory cell string to a source based on a select gate voltage. The example apparatus further includes a current control circuit coupled to the select gate. The current control circuit is configured to limit current through the memory cell string during a memory access operation based on a reference current.

25 Claims, 5 Drawing Sheets

APPARATUSES AND METHODS FOR LIMITING STRING CURRENT IN A MEMORY

TECHNICAL FIELD

Embodiments of the invention relate generally to electronic memories, and more particularly, in one or more of the illustrated embodiments, to limiting string current in a memory.

DESCRIPTION OF RELATED ART

Advances in technology have resulted in high density memory architectures and increased portability of technologies including high density memory architectures are increasingly power conscious. Certain memory architectures are susceptible to increased power consumption while performing certain operations. For example, some NAND flash memories may be susceptible to increased string current for a memory cell string during memory access operations. In certain architectures, memory access operations may result in increased string current across multiple memory cell strings, which may increase power consumption beyond specifications. As a result, performing certain memory access operations in NAND flash memories may be limited to a small number of memory cell strings, which may reduce efficiency in performing the memory access operations, or in some instances, prevent certain testing operations.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
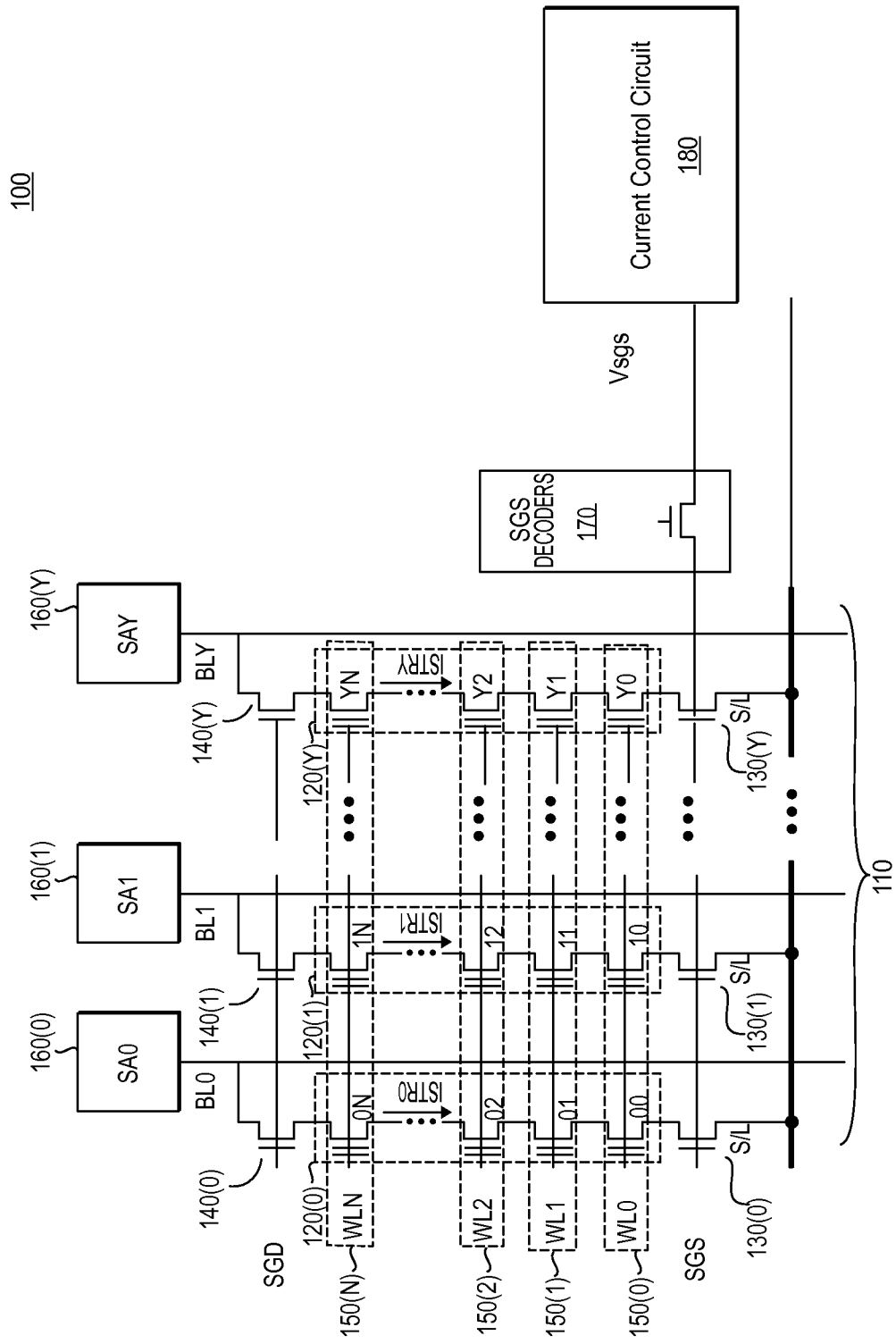
FIG. 1 is a block diagram of a particular illustrative embodiment of an apparatus including a current control circuit according to an embodiment of the disclosure.

Referring to FIG. 1, a particular illustrative embodiment of an apparatus including a current control circuit according to an embodiment of the invention is disclosed and generally designated 100. The apparatus 100 may be an integrated circuit, a memory device, a memory system, an electronic device or system, a smart phone, a tablet, a computer, a server, etc. The apparatus 100 may include a current control circuit 180 that may limit a maximum string current during a memory access operation. The apparatus 100 may include a memory array 110 coupled to the current control circuit 180.

The memory array 110 may include a block, a section, or other group of memory cells 00-YN. As illustrated in FIG. 1, the memory array 110 may include memory cells 00-YN, where memory cells 00-0N, memory cells 10-1N, and memory cells Y0-YN are coupled together serially to form a respective memory cell string 120(0-Y). Each memory cell string 120(0-Y) is coupled to a respective bitline BL0-BLY via a respective drain select gate 140(0-Y). A sense circuit SA0-SAY 160(0-Y) is coupled to a respective bitline BL0-BLY. The sense circuits SA0-SAY 160(0-Y) are configured to sense a data state provided on a respective bit line by memory cells being accessed and determine a data value. In some embodiments, the sense circuits SA0-SAY 160(0-Y) may be sense amplifier circuits, and may sense and amplify a data state provided on a respective bit line by memory cells being accessed and determine a data value. Each memory cell string 120(0-Y) is further coupled to a common source line (S/L) via a respective source select gate 130(0-Y). Further, rows of memory cells may be coupled to a respective wordline WL0-WLN to form a respective memory cell page 150(0-N) (e.g., memory cells 00-Y0 are coupled to wordline WL0; memory cells 01-Y1 are coupled to wordline WL1; memory cells 02-Y2, are coupled to wordline WL2; etc.). In some embodiments, the memory cells 00-YN are single level cells (SLC) storing a single bit of data. In other embodiment, the memory cells 00-YN are multi-level cells (MLC) (e.g., 4, 8, 16, etc., levels) storing multiple bits of data (e.g., 2, 3, 4, etc., bits, respectively). The current control circuit 180 may be selectively coupled to the memory array via a source select gates (SGS) decoder 170. For example, respective gates of the source select gates 130(0-Y) may be coupled to the current control circuit 180 via a source select gates (SGS) decoders 170. A depicted in FIG. 1, the SGS decoder 170 is represented by a switch. It will be appreciated that the SGS decoder 170 may include additional switches. Further, the SGS decoder 170 may couple the current control circuit 180, or other current control circuits, to other memory arrays, in addition to coupling the current control circuit 180 to the memory array 110. The drain select gates 140(0-Y) and the source select gates 130(0-Y) are illustrated in FIG. 1 as n-type transistors. Other types of circuits may be used for the drain select gates 140(0-Y) and the source select gates 130(0-Y) without departing from the scope of the present disclosure.

In operation, during a memory access operation associated with an accessed memory cell page 150(0-N), one or more of the sense circuits 160(0-Y) may provide a precharge voltage to the respective bitlines BL0-BLY. Additionally, the wordlines WL0-WLN associated with other memory cell pages 150(0-N) of the memory array 110 other than the accessed memory cell page 150(0-N) may be set to an enable voltage. The enable voltage may activate (e.g., enable) the respective memory cells (00-YN) of the other memory cell pages 150(0-N). Further during the memory access operation, a drain select gate voltage VSGD may be provided to the respective gates of the drain select gates 140(0-Y) to activate the drain select gates 140(0-Y). The activated drain select gates 140(0-Y) may couple the respective memory cell string 120(0-Y) to the respective bitline BL0-BLY. The current control circuit 180 may provide a source gate select voltage VSGS to the respective gates of the source select gates 130(0-Y), via the SGS decoder 170, to activate (e.g., enable) the source select gates 130(0-Y). The activated source select gates 130(0-Y) may couple the respective memory cell strings 120(0-Y) to the S/L. The wordline WL0-WLN coupled to the accessed memory cell page 150(0-N) may be set to an access voltage. Providing the access voltage to the memory cells of the accessed memory cell page 150(0-Y) may activate the memory cells of the accessed memory cell page 150(0-Y) based on a data state of the memory cells. The sense circuits 160(0-Y) may determine the data state of the memory cells of the accessed memory cell page 150(0-N) based on the respective current ISTR0-ISTRY through the respective memory cell string 120(0-Y). For example, responsive to a memory cell having an activated state, the ISTR0-ISTRY current may flow from the respective bitline BL0-BLY through the respective memory cell string 120(0-Y) to the S/L, which may decrease the respective bitline BL0-BLY voltage below the precharge voltage. The sense circuits 160(0-Y) may determine a first data value stored in the respective memory cell based on the reduced bitline voltage. Responsive to the memory cell having a second state, the ISTR0-ISTRY current may be restricted from flowing through the memory cell (e.g., the memory cell remains deactivated) and the respective bitline voltage may be equal to the precharge voltage. The sense circuits 160(0-Y) may determine a second data value is stored in the respective memory cell based on the bitline voltage being equal to the precharge voltage.

As explained above, the memory cells 00-YN may be MLC memory cells. MLC memory cells may have several different threshold voltages at which they become activated, with each threshold voltage indicative of a particular data value. Thus, in some embodiments, the sense circuits 160(0-Y) determining a data value stored in an MLC memory cell may be further based on a voltage of the respective wordline when the memory cell changes to the activated state. For example, the memory access operation may be an iterative process of setting the wordline of an accessed memory cell page 150(0-Y) to a voltage and the sense circuits 160(0-Y) determining whether the respective ISTR0-ISTRY current has caused the respective bitline voltage to decrease below the precharge voltage (e.g., whether the respective memory cell is activated). Responsive to detecting the activation of the memory cell, the sense circuits 160(0-Y) may determine a data value of the memory cells based on the voltage of the wordline of the accessed memory cell page. Responsive to detecting that the memory cell remains deactivated, the voltage of the accessed wordline may be increased by a step and the process may be repeated. In some embodiments, the wordline voltage may be ramped from an initial value. While the wordline voltage is ramping, the sense circuits 160(0-Y) continuously monitor whether the ISTR0-ISTRY current has caused the respective bitline voltage to decrease below the precharge voltage (e.g., the respective memory cell is activated). Responsive to detecting the activation of the memory cell, the apparatus 100 may determine a data value stored in the memory cell based on a voltage of the wordline when the memory cell is activated. In some embodiments, memory cells of the accessed memory cell page 150(0-N) that have been activated by the ramping of the wordline voltage may remain activated as the wordline voltage continues to ramp.

The memory access operation may be a read access operation and/or a program verify access operation. When accessing a plurality of memory cells of the accessed memory cell page 150(0-N), the activated memory cells of the accessed memory cell page 150(0-Y) may result in respective ISTR0-ISTRY currents through the respective memory cell strings 120(0-Y). Power consumption during the memory access operation may increase as the number of active memory cells increases due to the additional ISTR0-ISTRY currents. In the ramped wordline voltage example, once activated, memory cells of the accessed memory cell page 150(0-N) may remain activated as the wordline voltage continues to be ramped. In some cases, once activated, the individual ISTR0-ISTRY currents through the respective bitlines BL0-BLY of the activated memory cells may increase as the wordline voltage increases. In some embodiments, the ISTR0-ISTRY current through a respective bitline with an activated memory cell may increase to 1 µA or greater. Further, additional memory cells of the accessed memory cell page 150(0-N) may become activated as the wordline voltage continues ramping (e.g., causing respective additional ISTR0-ISTRY currents through the respective memory cell string 120(0-Y). As an example, if a memory cell page 150(0-N) includes 32 KB bitlines, the worst case current consumption may be 32 KB*1 µA=256 mA, and the resulting increased power consumption may exceed performance specification limits.

The current control circuit 180 may be configured to limit power consumption in the memory array 110 during a memory access operation by limiting ISTR0-ISTRY current through the memory cell strings 120(0-Y). For example, the current control circuit 180 may control a value of the VSGS voltage to the source select gates 130(0-Y) to limit (e.g., restrict) the ISTR0-ISTRY current through the respective source select gate 130(0-Y). The current control circuit 280 may adjust the value of the VSGS voltage at the gate of the respective source select gate 130(0-Y) to change a resistance through the source select gate 130(0-Y). The changed resistance through the source select gate 130(0-Y) may limit the ISTR0-ISTRY current flow through the respective source select gate 130(0-Y). The sense circuits 160(0-Y) may require at least a minimum threshold amount of ISTR0-ISTRY current in order to accurately detect a data value stored in a respective memory cell. The current control circuit 180 may limit the ISTR0-ISTRY current to a magnitude that is at least as great as the minimum threshold amount of ISTR0-ISTRY current required by the sense circuits 160(0-Y). In some embodiments, the current control circuit 180 may limit the ISTR0-ISTRY current to a value that is five percent of the maximum ISTR0-ISTRY current. As explained above, the maximum ISTR0-ISTRY current may be 1 µA. In some embodiments, the current control circuit 180 may control the VSGS voltage to limit the ISTR0-ISTRY current to less than 50 nA. In some embodiments, the current control circuit 180 may control the value of the VSGS voltage based on a reference voltage. In other embodiments, the current control circuit 180 may control the value of the VSGS voltage dynamically based on a model string circuit. Other embodiments of the current control circuit 180 will be described further with reference to FIGS. 2-4.

While FIG. 1 depicts the apparatus 100 with at least three bitlines BL0-BLY coupled to respective sense circuits 160(0-Y), the apparatus 100 may include any number of bitlines coupled to respective sense circuits. Similarly, although at least four WL0-WLY wordlines, are illustrated in FIG. 1, the apparatus 100 may include any number of wordlines.

Limiting the ISTR0-ISTRY current through memory cell strings 120(0-Y) may reduce power consumption during a memory access operation. The reduced power consumption during the memory access operation may allow an all-bitline test (ABT) to be performed without exceeding performance specification limits.

Figure 2:
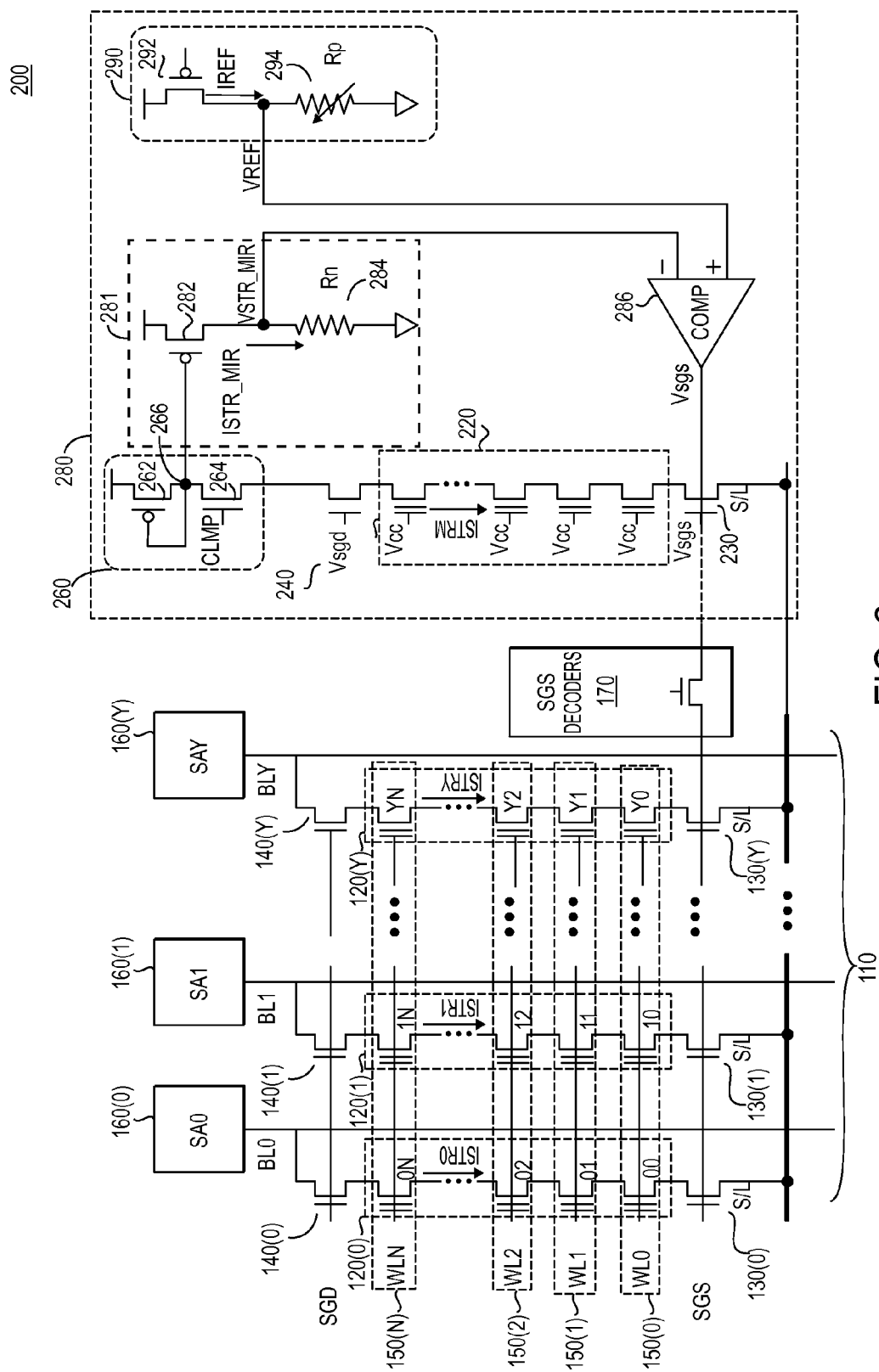
FIG. 2 is a block diagram of a particular illustrative embodiment of an apparatus including a current control circuit according to an embodiment of the disclosure.

Referring to FIG. 2, a particular illustrative embodiment of an apparatus including a current control circuit according to an embodiment of the invention is disclosed and generally designated 200. The apparatus 200 may include a current control circuit 280 that may limit a maximum string current during a memory access operation. The apparatus 200 includes elements that have been previously described with respect to the apparatus 100 of FIG. 1. Those elements have been shown in FIG. 2 using the same reference numbers used in FIG. 1 and operation of the common elements is as previously described. Consequently, a detailed description of the operation of these elements will not be repeated in the interest of brevity. The current control circuit 280 may be used in the current control circuit 180 of FIG. 1.

The current control circuit 280 may include a model sense circuit 260 coupled to a model memory cell string 220. The model memory cell string 220 may model a memory cell string 120(0-Y). When activated, the model memory cell string may provide a model string current ISTRM that models an ISTR0-ISTRY current. The current control circuit 280 may further include a mirror circuit 281 configured to mirror the ISTRM current to provide a mirrored model string current ISTR_MIR. The mirror circuit 281 may provide a mirrored string voltage VSTR_MIR to a comparator 286. The comparator 286 may provide a source select gate voltage VSGS based on a comparison of the VSTR_MIR voltage and a reference voltage VREF received from a reference circuit 290.

The model sense circuit 260 may be coupled to the model memory cell string 220 via a model drain select gate 240. The model memory cell string 220 may be coupled to the source line (S/L) via a model source select gate 230. In some embodiments, the model sense circuit 260 may model a sense circuit 160(0-Y). Further, the model source select gate 230 and the model drain select gate 240 may model a source select gate 130(0-Y) and a drain select gate 140(0-Y), respectively. It will be appreciated that the model memory cell string 220 may model a memory cell string of the memory cell string 120(0-Y) using means other than memory cells, such as a resistance that models the resistance of the memory cell string 120(0-Y). The model memory cells of the model memory cell string 220 may be activated responsive to receiving the VCC voltage at each respective gate. The activated model memory cells of the model memory cell string 220 may provide the ISTRM current between the model sense circuit 260 and the S/L. The model sense circuit 260 may include a first model sense circuit (SA) transistor 262 coupled in series with a second model SA transistor 264. The gate of the first model SA transistor 262 may be coupled to a node 266 between the first model SA transistor 262 and the second model SA transistor 264. The gate of the second model SA transistor 264 is configured to receive a bitline clamp voltage CLMP. In some embodiments, the first model SA transistor 262 may be a p-type transistor and the second model SA transistor 264 may be an n-type transistor.

The mirror circuit 281 may include a mirror transistor 282 coupled in series with a mirror resistance 284. The gate of the mirror transistor 282 may be coupled to the node 266 of the model sense circuit 260. The mirror resistance 284 may have a resistance that approximates the resistance along the model memory cell string 220 from the model sense circuit 260 to the S/L. Thus, the mirror circuit may mirror the ISTRM current through the model memory cell string (e.g., and the model source select gate 230 and the model drain select gate 240) to provide a mirrored string current ISTR_MIR. The reference circuit 290 may include a reference transistor 292 coupled serially with a variable resistance 294. A gate of the reference transistor 292 may receive an enable voltage to activate the reference transistor 292, and provide a configurable reference current IREF through the variable resistance 294. As, the IREF current is driven through the reference circuit 290, and the VREF voltage is provided at a node between the reference transistor 292 and the variable resistance 294. The comparator 286 may provide the VSGS voltage having a value based on the difference between the VREF voltage and the VSTR_MIR voltage.

In operation, as explained with reference to FIG. 1, during a memory access operation associated with an accessed memory cell page 150(0-N), the sense circuits 160(0-Y) provide a precharge voltage to the respective bitlines BL0-BLY, and the sense circuits 160(0-Y) may determine the state of the memory cell of the accessed memory cell page 150(0-N) based on the respective ISTR0-ISTRY current through the respective memory cell string 120(0-Y). In some embodiments, the memory access operation may be a read access operation and/or a program verify access operation. When accessing a plurality of memory cells of the accessed memory cell page 150(0-N), the activated memory cells may result in a respective ISTR0-ISTRY current through the respective memory cell string 120(0-Y). Power consumption during the memory access operation may increase as the number of active memory cells increases due to the additional ISTR0-ISTRY currents. For example, in a ramped wordline voltage example, once activated, memory cells of the accessed memory cell page 150(0-N) may remain activated as the wordline voltage continues to be ramped. In some cases, once activated, the individual ISTR0-ISTRY currents through the respective bitlines BL0-BLY coupled to the activated memory cells may increase as the wordline voltage increases. Further, additional memory cells of the accessed memory cell page 150(0-N) may become activated as the wordline voltage continues to ramp (e.g., causing respective additional ISTR0-ISTRY currents through the respective memory cell string 120(0-Y)).

The current control circuit 280 may limit power consumption in the memory array 110 during a memory access operation by controlling the VSGS voltage based on the VREF voltage. For example, the current control circuit 280 may control a value of the VSGS voltage to limit (e.g., restrict) the ISTR0-ISTRY current through the respective source select gate 130(0-Y) and the model source select gate 230 based on the VREF voltage. The current control circuit 280 may adjust the value of the VSGS voltage at the gate of the respective source select gate 130(0-Y) and the model source select gate 230 to change a resistance of the source select gates 130(0-Y) and the model source select gate 230. The changed resistance of the source select gate 130(0-Y) and the model source select gate 230 may limit the ISTR0-ISTRY currents and the ISTRM current through the respective source select gate 130(0-Y) and the model source select gate 230. The value of the VSGS voltage may be determined by comparing the VREF voltage to the VSTR_MIR voltage, which is provided via a feedback loop that may include the model memory cell string 220, the model sense circuit 260, and the mirror circuit 281.

The model sense circuit 260 may provide a precharge voltage to the model memory cell string 220 by activating the second SA amplifier 264 based on the CLMP voltage. All model memory cells of the model memory cell string 220 may be activated (e.g., via the VCC voltage at the gates), which may allow the ISTRM current to flow through the model memory cell string 220. The ISTRM current may model the ISTR0-ISTRY current through a memory cell string 120(0-Y). The voltage at the node 266 may be based on the ISTRM current through the model memory cell string 220. The mirror transistor 282 of the mirror circuit 281 may receive the voltage at the node 266, and may provide the ISTR_MIR current through the mirror resistance 284 based on the voltage of the node 266. The ISTR_MIR current may mirror the ISTRM current through the model memory cell string 220. The mirror circuit 281 may provide the VSTR_MIR voltage to the comparator 286 having a value based on the ISTR_MIR current. The comparator 286 may provide the VSGS voltage based on a comparison between the VSTR_MIR voltage and the VREF voltage received from the reference circuit 290. The reference circuit 290 may provide the VREF voltage having a value based on a value of an IREF current through the variable resistance 294. The value of the IREF current may be based on the resistance of the variable resistance 294. As explained above, the sense circuits 160(0-Y) may require at least a minimum threshold amount of ISTR0-ISTRY current in order to accurately detect a data value stored in a respective memory cell. The current control circuit 280 may limit the ISTR0-ISTRY current to a magnitude that is at least as great as the minimum threshold amount of ISTR0-ISTRY current required by the sense circuits 160(0-Y). Thus, the VREF voltage provided by the reference circuit 290 may have a value that results in limiting the ISTR0-ISTRY currents to values at least as great as the minimum threshold amount. In some embodiments, the 280 may limit the ISTR0-ISTRY current based on a type of memory access operation. For example, during a read and/or a program verify memory access operation, the current control circuit 280 may limit the ISTR0-ISTRY current to values less than a value that the current control circuit 280 limits the ISTR0-ISTRY current during another type of memory access operation. In some embodiments, the current control circuit 280 may limit the ISTR0-ISTRY current during a first type of memory access to five percent of a value that the current control circuit 280 limits the ISTR0-ISTRY current to during a second type of memory access. As explained above, the maximum ISTR0-ISTRY current may be 1 μA. In some embodiments, the current control circuit 280 may control the VSGS voltage to limit the ISTR0-ISTRY current to 50 nA.

Figure 3:
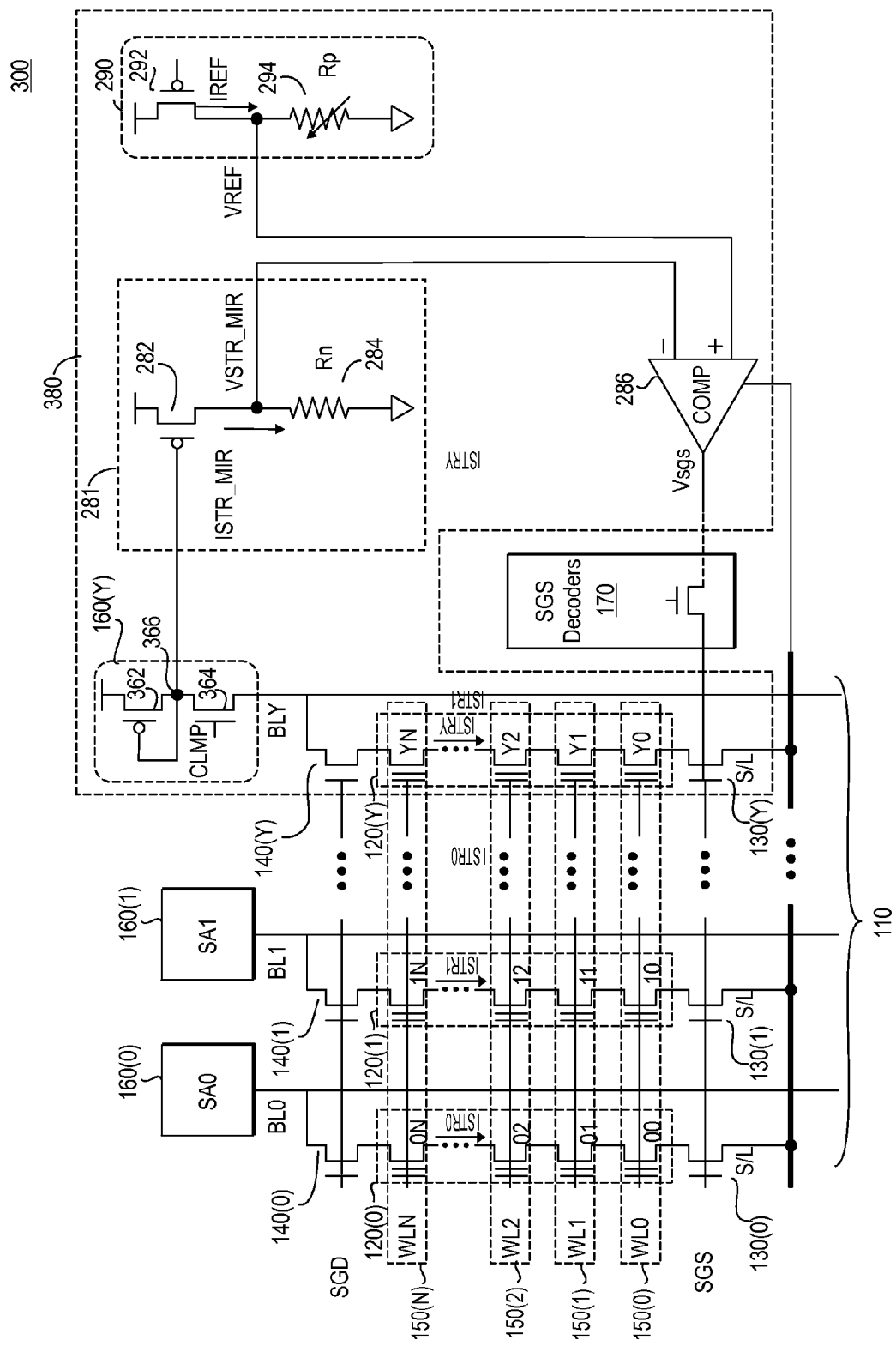
FIG. 3 is a block diagram of a particular illustrative embodiment of an apparatus including a current control circuit according to an embodiment of the disclosure.

Referring to FIG. 3, a particular illustrative embodiment of an apparatus including a current control circuit according to an embodiment of the invention is disclosed and generally designated 300. The apparatus 300 may include a current control circuit 380 that may limit a maximum string current during a memory access operation. The apparatus 300 includes elements that have been previously described with respect to the apparatus 100 of FIG. 1 and the apparatus 200 of FIG. 2. Those elements have been shown in FIG. 3 using the same reference numbers used in FIGS. 1 and/or 2, and operation of the common elements is as previously described. Consequently, a detailed description of the operation of these elements will not be repeated in the interest of brevity. The current control circuit 380 may be used in the current control circuit 180 of FIG. 1. The current control circuit 380 may include elements of the current control circuit 280 of FIG. 2.

The current control circuit 380 may include the sense circuit 160(Y), the drain select gate 140(Y), the memory cell string 120(Y), and the source select gate 130(Y) of the memory array 110 that are configured to provide the ISTRY current from the bitline BLY to the S/L. The current control circuit 380 may further include a mirror circuit 281 configured to mirror the ISTRY current to produce a mirrored model string current ISTR_MIR. The mirror circuit 281 may provide a mirrored string voltage VSTR_MIR to a comparator 286. The comparator 286 may provide a source gate select voltage VSGS to the source select gates 130(0-Y) based on a comparison of the VSTR_MIR voltage and the reference voltage VREF received from the reference circuit 290.

The sense circuit 160(Y) may be coupled to the memory cell string 120(Y) via the drain select gate 140(Y). The memory cell string 120(Y) may be coupled to the source line (S/L) via a source select gate 130(Y). The memory cells Y0-YN of the memory cell string 120(Y) may each be erased. By erasing the memory cells Y0-YN, the memory cells Y0-YN may be activated during a memory access operation. The activated memory cells Y0-YTN may provide the ISTRY current while the precharge voltage is applied via the sense circuit 160(Y), the drain select gate 140(Y) is activated, and the source select gate 130(Y) is activated. The sense circuit 160(Y) may include a first SA transistor 362 coupled in series with a second SA transistor 364. The gate of the first SA transistor 362 may be coupled to a node 366 between the first SA transistor 362 and the second SA transistor 364. The gate of the second SA transistor 364 may receive a bitline clamp voltage CLMP. The node 366 may be coupled to the gate of the mirror transistor 282 of the mirror circuit 281.

In operation, as explained with reference to FIG. 1, during a memory access operation associated with an accessed memory cell page 150(0-N), the sense circuits 160(0-Y) provide a precharge voltage (e.g., by providing the CLMP voltage to activate the second SA transistor 364) to the respective bitlines BL0-BLY, and the sense circuits 160(0-Y) may determine the state of the memory cell of the accessed memory cell page 150(0-N) based on the respective ISTR0-ISTRY current through the respective memory cell string 120(0-Y). In some embodiments, the memory access operation may be a read access operation and/or a program verify access operation. When accessing a plurality of memory cells of the accessed memory cell page 150(0-N) associated with the memory access operation, the activated memory cells may result in a respective ISTR0-ISTRY current through the respective memory cell string 120(0-Y). Power consumption during the memory access operation may increase as the number of active memory cells increases due to the additional ISTR0-ISTRY currents. For example, in the ramped wordline voltage example, once activated, memory cells of the accessed memory cell page 150(0-N) may remain activated as the wordline voltage continues to be ramped. In some cases, once activated, the individual ISTR0-ISTRY currents through the respective bitlines of the activated memory cells of the memory cell page 150(0-N) may increase as the wordline voltage increases. Further, additional memory cells of the accessed memory cell page 150(0-N) may become activated as the wordline voltage continues to ramp (e.g., causing respective additional ISTR0-ISTRY currents through the respective memory cell string 120(0-Y)).

The current control circuit 380 may limit power consumption in the memory array 110 during a memory access operation by controlling the VSGS voltage based on the VREF voltage similar to the current control circuit 280 of FIG. 2, except that the memory cell string 120(Y) and the sense circuit 160(Y) of the memory array 110 are used rather than the model memory cell string 220 and the model sense circuit 260. For example, the current control circuit 380 may control a value of the VSGS voltage to limit (e.g., restrict) the ISTR0-ISTRY current through the respective source select gate 130 (0-Y). The current control circuit 380 may adjust the value of the VSGS voltage at the gate of the respective source select gate 130(0-Y) to change a resistance of the source select gate 130(0-Y). The changed resistance of the 130(0-Y) may change the ISTR0-ISTRY current limit through the respective source select gate 130(0-Y). The value of the VSGS voltage may be determined by comparing the VREF voltage to the VSTR_MIR voltage, which is provided via a feedback loop that may include the memory cell string 120(Y), the sense circuit 160(Y), and the mirror circuit 281.

As explained above, all of the memory cells Y0-YN of the memory cell string 120(Y) may be activated (e.g., by erasing the memory cells Y0-YN) to allow the ISTRY current to flow through the memory cell string 120(Y). The ISTRY current may model the ISTR0-(ISTRY-1) current through a memory string of the memory cell string 120(0-(Y-1)). The voltage at the node 366 may be based on the ISTRY current through the memory cell string 120(Y). The mirror transistor 282 of the mirror circuit 281 may receive the voltage of the node 366, and may provide the ISTR_MIR current through the mirror resistance 284 based on the voltage of the node 366. The ISTR_MIR may mirror the ISTRY current through the memory cell string 120(Y). The mirror circuit 281 may provide the VSTR_MIR voltage to the comparator 286 having a value based on the ISTR_MIR current. The comparator 286 may provide the VSGS voltage based on a comparison between the VSTR_MIR voltage and the VREF voltage received from the reference circuit 290. As explained with reference to FIG. 2, the reference circuit 290 may provide the VREF voltage having a value based on a value of an IREF current through the reference circuit 290. The value of the IREF current may be based on the resistance of the variable resistance 294. In some embodiments, the variable resistance 294 may be adjusted to change the value of the VREF voltage, which may change the ISTR0-ISTRY current limit. As explained above, the sense circuits 160(0-Y) may require at least a minimum threshold amount of ISTR0-ISTRY current in order to accurately detect a data value stored in a respective memory cell. The current control circuit 380 may limit the ISTR0-ISTRY current to a magnitude that is at least as great as the minimum threshold amount of ISTR0-ISTRY current required by the sense circuits 160(0-Y). Thus, the VREF voltage provided by the reference circuit 290 may have a value that results in limiting the ISTR0-ISTRY currents to values at least as great as the minimum threshold amount. In some embodiments, the 380 may limit the ISTR0-ISTRY current based on a type of memory access operation. For example, during a read and/or a program verify memory access operation, the current control circuit 380 may limit the ISTR0-ISTRY current to values less than a value that the current control circuit 380 limits the ISTR0-ISTRY current during another type of memory access operation.

Figure 4:
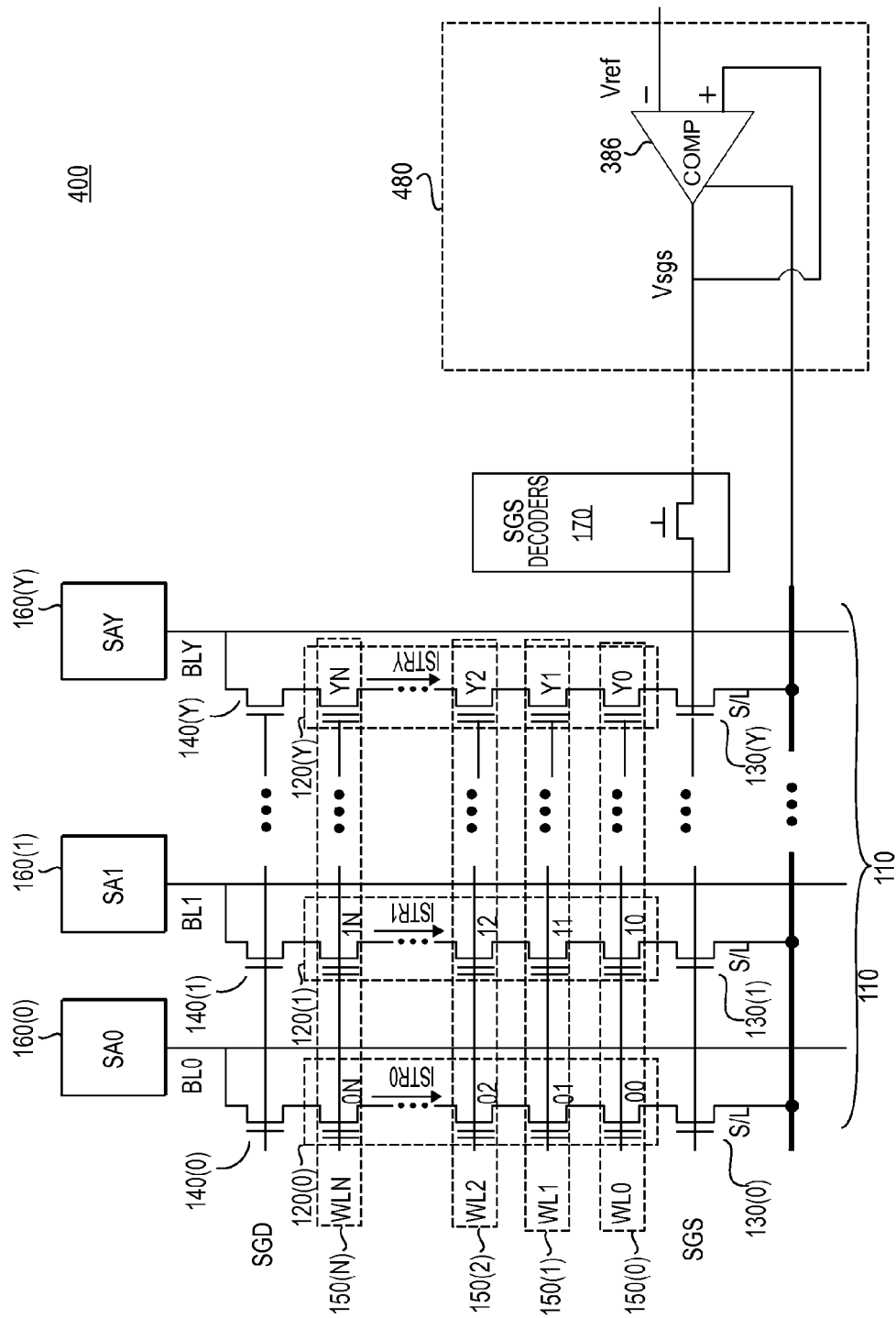
FIG. 4 is a block diagram of a particular illustrative embodiment of an apparatus including a current control circuit according to an embodiment of the disclosure.

Referring to FIG. 4, a particular illustrative embodiment of an apparatus including a current control circuit according to an embodiment of the invention is disclosed and generally designated 400. The apparatus 400 may include a current control circuit 480 that may limit a maximum string current during a memory access operation. The apparatus 400 includes elements that have been previously described with respect to the apparatus 100 of FIG. 1. Those elements have been shown in FIG. 4 using the same reference numbers used in FIG. 1 and operation of the common elements is as previously described. Consequently, a detailed description of the operation of these elements will not be repeated in the interest of brevity. The current control circuit 480 may be used in the current control circuit 180 of FIG. 1.

The current control circuit 480 may include a comparator 486 configured to receive a reference voltage VREF at a first input and a feedback of a source select gate voltage VSGS at a second input. The comparator 486 may provide the VSGS voltage having a value based on a value of the VREF voltage and a value of a feedback VSGS voltage. The VREF voltage may be an externally controlled voltage.

In operation, as explained with reference to FIG. 1, during a memory access operation associated with a memory cell page 150(0-N), the sense circuits 160(0-Y) provide a precharge voltage to the respective bitlines BL0-BLY. The sense circuits 160(0-Y) may determine the state of the memory cell of the memory cell page 150(0-N) based on the respective ISTR0-ISTRY current through the respective memory cell string 120(0-Y). In some embodiments, the memory access operation may be a read access operation and/or a program verify access operation. When accessing a plurality of memory cells of the accessed memory cell page 150(0-N) associated with the memory access operation, the activated memory cells may result in a respective ISTR0-ISTRY current through the respective memory cell string 120(0-Y). Power consumption during the memory access operation may increase as the number of active memory cells increases due to the additional ISTR0-ISTRY currents. For example, in the ramped wordline voltage example, once activated, memory cells of the accessed memory cell page 150(0-N) may remain activated as the voltage of the wordline voltage continues to be ramped. In some cases, once activated, the individual ISTR0-ISTRY currents through the respective bitlines of the activated memory cells of the accessed memory cell page 150(0-N) may increase as the wordline voltage increases. Further, additional memory cells of the accessed memory cell page 150(0-N) may be activated as the wordline voltage continues to ramp (e.g., causing respective additional ISTR0-ISTRY currents through the respective memory cell string 120(0-Y)).

The current control circuit 480 may limit power consumption in the memory array 110 during a memory access operation by controlling the VSGS voltage based on the reference voltage. For example, the current control circuit 480 may control a value of the VSGS voltage to limit (e.g., restrict) the ISTR0-ISTRY current through the respective source select gate 130(0-Y). The current control circuit 480 may adjust the value of the VSGS voltage at the gate of the respective source select gates 130(0-Y) to change a resistance of the source select gate 130(0-Y). The changed resistance of the source select gate 130(0-Y) may change the ISTR0-ISTRY current limit through the respective source select gate 130(0-Y). The value of the VSGS voltage may be determined by comparing the VREF voltage to the VSTR_MIR voltage that is fed back to the second input of the comparator 486.

As explained above, the sense circuits 160(0-Y) may require at least a minimum threshold amount of ISTR0-ISTRY current in order to accurately detect a data value stored in a respective memory cell. The current control circuit 480 may limit the ISTR0-ISTRY current to a magnitude that is at least as great as the minimum threshold amount of ISTR0-ISTRY current required by the sense circuits 160(0-Y). Thus, the VREF voltage provided to the current control circuit 480 may have a value that results in limiting the ISTR0-ISTRY currents to values at least as great as the minimum threshold amount. In some embodiments, the current control circuit 480 may limit the ISTR0-ISTRY current based on a type of memory access operation. For example, during a read and/or a program verify memory access operation, the current control circuit 480 may limit the ISTR0-ISTRY current to values less than a value that the current control circuit 480 limits the ISTR0-ISTRY current to during another type of memory access operation. In some embodiments, the current control circuit 480 may limit the ISTR0-ISTRY current during a first type of memory access to five percent of a value that the current control circuit 480 limits the ISTR0-ISTRY current to during a second type of memory access. As explained above, the maximum ISTR0-ISTRY current may be 1 µA. In some embodiments, the current control circuit 180 may control the VSGS voltage to limit the ISTR0-ISTRY current to 50 nA.

Figure 5:
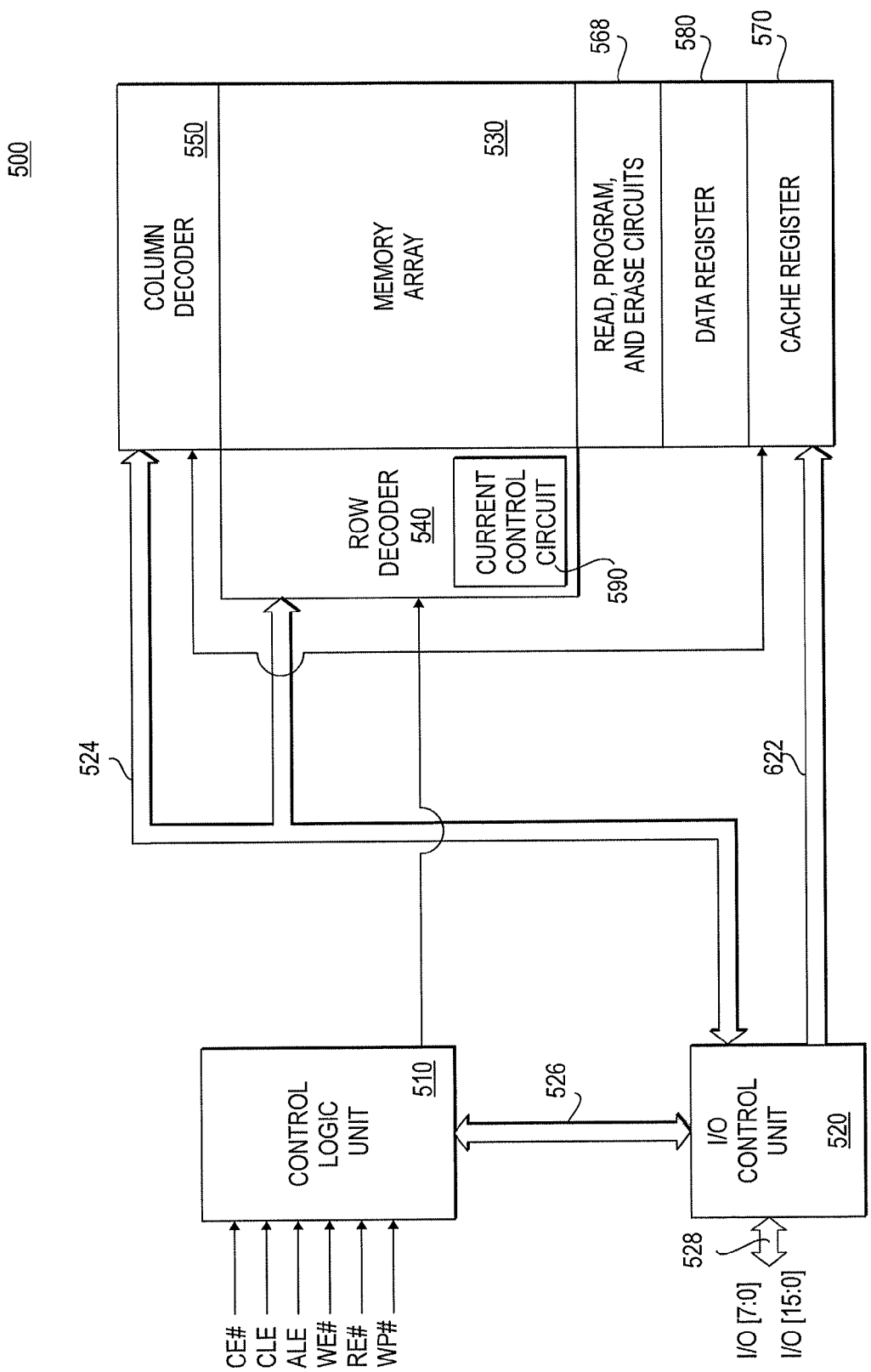
FIG. 5 is a block diagram of a memory including a current control circuit according to an embodiment of the disclosure.

FIG. 5 illustrates a memory 500 according to an embodiment of the present invention. The memory 500 includes a memory array 530 with a plurality of memory cells. The memory cells may be non-volatile memory cells, such as NAND flash cells, phase change memory cells, or may generally be any type of memory cells.

Command signals, address signals and data signals may be provided to the memory 500 as sets of sequential input/output ("I/O") signals transmitted through an I/O bus 528. Similarly, data signals may be provided from the memory 500 through the I/O bus 528. The I/O bus 528 is connected to an I/O control unit 520 that routes the signals between the I/O bus 528 and an internal data bus 522, an internal address bus 524, and an internal command bus 526. The memory 500 also includes a control logic unit 510 that receives a number of control signals either externally or through the command bus 526 to control the operation of the memory 500.

The address bus 524 applies block-row address signals to a row decoder 540 and column address signals to a column decoder 550. The row decoder 540 and column decoder 550 may be used to select blocks of memory or memory cells for memory operations, for example, read, program, and erase operations. In some embodiments, the row decoder 540 may include a current control circuit 590 that may limit string current magnitudes in the memory array 530 during certain memory access operations. The current control circuit may include the current control circuit 180 of FIG. 1, the current control circuit 280 of FIG. 2, the current control circuit 380 of FIG. 3, the current control circuit 480 of FIG. 4, or a combination thereof. The column decoder 550 may enable data signals to be applied to columns of memory corresponding to the column address signals and allow data signals to be coupled from columns corresponding to the column address signals.

In response to the memory commands decoded by the control logic unit 510, the memory cells in the array 530 are read, programmed, or erased. Read, program, and erase circuits 568 coupled to the memory array 530 receive control signals from the control logic unit 510 and include current generators for generating various reference currents for read, program and erase operations. In addition to the signal line drivers in the row decoder 540 and/or column decoder 550, one or more of the voltage generators or other read, program, and erase circuits 568 may also include signal line drivers.

After the row address signals have been applied to the address bus 524, the I/O control unit 520 routes data signals to a cache register 570. The data signals are stored in the cache register 570 in successive sets each having a size corresponding to the width of the I/O bus 528. The cache register 570 sequentially stores the sets of data signals for an entire row or page of memory cells in the array 530. All of the stored data signals are then used to program a row or page of memory cells in the array 530 selected by the block-row address coupled through the address bus 524. In a similar manner, during a read operation, data signals from a row or block of memory cells selected by the block-row address coupled through the address bus 524 are stored in a data register 580. Sets of data signals corresponding in size to the width of the I/O bus 528 are then sequentially transferred through the I/O control unit 520 from the data register 580 to the I/O bus 528.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a memory array comprising a plurality of memory cell strings, a memory cell string of the plurality of memory cell strings including a respective plurality of memory cells, the memory cell string coupled between a respective bitline and a source,
   a plurality of sense circuits, a sense circuit of the plurality of sense circuits coupled to the respective bit line and configured to determine a data state of a memory cell of the respective plurality of memory cells of the memory cell string based on a current through the memory cell string;
   a plurality of select gates, wherein a select gate of the plurality of select gates is configured to couple the memory cell string to the source based on a variable select gate voltage received at a gate of the select gate, wherein the select gate is a transistor; and
   a current control circuit coupled to the gate of the select gate, the current control circuit configured to provide the variable select gate voltage to the gate of the select gate and adjust current through the memory cell string during a memory access operation based on the variable select gate voltage,
   wherein the current control circuit comprises a reference circuit having a variable resistance, and a value of the variable select gate voltage varies responsive to a change in a value of the variable resistance.

2. The apparatus of claim 1, wherein the current control circuit is configured to control the select gate to limit current through the memory cell string during a memory access operation.

3. The apparatus of claim 1, wherein the current control circuit comprises a comparator configured to receive a reference voltage, the comparator configured to provide the variable select gate voltage to the plurality of select gates based on the reference voltage.

4. The apparatus of claim 1, wherein a respective memory cell of the respective plurality of memory cells of the memory cell string is coupled to a wordline, wherein, during the memory access operation, a voltage of the wordline is ramped from an initial value, wherein a data value stored in the memory cell is determined based on the voltage of the wordline when the memory cell becomes activated.

5. The apparatus of claim 3, wherein the current control circuit further comprising a reference circuit configured to provide the reference voltage having a value based on the reference current through the reference circuit.

6. The apparatus of claim 3, wherein the current control circuit further comprises a mirror circuit configured to provide a mirror current that is related to the current through the memory cell string, the mirror circuit further configured to provide to the comparator a mirror voltage that is based on the mirror current, wherein the variable select gate voltage is based on a comparison of the mirror voltage and the reference voltage.

7. The apparatus of claim 3, wherein the reference voltage is a feedback select gate voltage.

8. The apparatus of claim 6, wherein the current control circuit further comprises:
- a model memory cell string comprising a plurality of model memory cells;
- a model select gate configured to couple the model memory cell string to the source responsive to the variable select gate voltage; and
- a model sense circuit comprising a first transistor coupled in series with a second transistor, wherein a gate of the first transistor is coupled to a node between the first transistor and the second transistor, wherein agate of a transistor of the current mirror circuit is coupled to the node between the first transistor and the second transistor, wherein the mirror current is based on a voltage of the node between the first transistor and the second transistor.

9. The apparatus of claim 8, wherein the first transistor is a p-type transistor and the second transistor is an n-type transistor.

10. The apparatus of claim 8, wherein the plurality of model memory cells are activated responsive to receiving a voltage at respective gates of the plurality of model memory cells.

11. The apparatus of claim 8, wherein the model memory cell string is included in the plurality of memory cell strings, wherein the model select gate is included in the plurality of select gates, and wherein the model sense circuit is included in the plurality of sense circuits.

12. An apparatus comprising:
- a memory cell string comprising a memory cell and coupled between a bitline and a source;
- a sense circuit configured to sense a current through the memory cell string;
- a select gate configured to couple the memory cell string to the source based on a variable select gate voltage received at a gate of the select gate, wherein the select gate is a transistor; and
- a current control circuit coupled to the gate of the select gate, the current control circuit configured to provide the variable select gate voltage to the gate of the select gate and adjust current through the memory cell string during a memory access operation based on the variable select gate voltage,
- wherein the current control circuit comprises a reference circuit having a variable resistance, and a value of the variable select gate voltage varies responsive to a change in a value of the variable resistance.

13. The apparatus of claim 12, wherein the current control circuit is configured to provide the variable select gate voltage based on a comparison of a reference voltage having a value based on the value of the variable resistance and a mirror voltage, wherein the mirror voltage is related to the current through the memory cell string.

14. The apparatus of claim 13, wherein the current control circuit comprises a reference voltage generator circuit configured to provide the reference voltage at a node of the reference voltage generator circuit.

15. The apparatus of claim 14, wherein the reference voltage generator circuit comprises the variable resistance.

16. The apparatus of claim 14, wherein the current control circuit further comprises:
- a model memory cell string comprising a model memory cell;
- a model select gate configured to couple the model memory cell string to the source responsive to the variable select gate voltage;
- a model sense circuit configured to provide a precharge voltage based on the current through the model memory cell string; and
- a current mirror circuit configured to mirror the current through the model memory cell string, the current mirror circuit further configured to provide the mirror current based on the precharge voltage from the model sense circuit.

17. The apparatus of claim 16, wherein the model sense circuit comprises a first transistor coupled in series with a second transistor, and the mirror circuit comprises a third transistor coupled in series with a resistance, wherein a gate of the first transistor and a gate of the third transistor are each coupled to a node between the first transistor and the second transistor.

18. A method, comprising:
- activating memory cells of a memory cell string coupled between a bitline and a source responsive to a memory access operation; and
- controlling a current through the memory cell string based on a reference voltage by controlling a variable voltage to a gate of a select gate configured to couple the memory cell string to the source, wherein the current through the memory cell string is reduced by reducing the variable voltage to the gate of the select gate from a first value to a second value,
- wherein the select gate is a transistor and a value of the reference voltage is adjusted responsive to adjusting a value of a variable resistance.

19. The method of claim 18, wherein controlling the current through the memory string based on the reference voltage comprises modeling a current through the memory cell string.

20. The method of claim 18, wherein controlling a current through the memory cell string based on the reference voltage comprises changing a resistance of the select gate coupled to the memory cell string based on the reference voltage.

21. The method of claim 19, wherein controlling the current through the memory string based on the reference voltage further comprises:
- comparing a mirror voltage based on the model current through memory cell string to the reference voltage; and
- controlling the variable voltage to the select gate based on the comparison of the mirror voltage and the reference voltage.

22. The method of claim 21, further comprising mirroring the model current through the memory cell, wherein the mirror voltage is based on the mirrored model current.

23. A method, comprising:
- activating memory cells of a memory cell string coupled between a bitline and a source responsive to a memory access operation; and
- controlling a current through the memory cell string based on a reference voltage by controlling a variable voltage to a gate of a select gate configured to couple the memory cell string to the source, wherein the current through the memory cell string is reduced by reducing the variable voltage to the gate of the select gate from a first value to a second value,
- wherein the select gate is a transistor and a value of the reference voltage is adjusted responsive to adjusting a value of a variable resistance,
- wherein the current through the memory cell string while the variable voltage has the second value is twenty percent of the current through the memory cell string while the variable voltage has the second value.

24. The method of claim 23, wherein the current through the memory cell string is limited based on a type of memory access operation.

25. The method of claim 23, wherein the memory access operation is one of a read access operation or a program verify access operation.

* * * * *